United States Patent
Kashiwaba

[11] Patent Number: 6,040,951
[45] Date of Patent: Mar. 21, 2000

[54] OPTICAL APPARATUS HAVING HARD CIRCUIT BOARD ENCODER

[75] Inventor: Seiichi Kashiwaba, Tokyo, Japan

[73] Assignee: Canon Kabushiki Kaisha, Tokyo, Japan

[21] Appl. No.: 08/990,638

[22] Filed: Dec. 15, 1997

Related U.S. Application Data

[63] Continuation of application No. 08/245,824, May 18, 1994, abandoned, which is a continuation of application No. 07/744,326, Aug. 13, 1991, abandoned.

[30] Foreign Application Priority Data

Aug. 16, 1990 [JP] Japan ................................ 2-216314

[51] Int. Cl.[7] .............................. G02B 7/02; G02B 15/14
[52] U.S. Cl. .................... 359/823; 359/697; 359/700; 396/89; 396/236; 396/529
[58] Field of Search .................... 359/823, 824, 359/684, 697, 698, 699, 700; 396/81, 87, 89, 236, 529

[56] References Cited

U.S. PATENT DOCUMENTS

| | | | |
|---|---|---|---|
| 4,682,871 | 7/1987 | Metabi | 396/236 |
| 4,999,656 | 3/1991 | Shimizu et al. | 396/89 |
| 5,023,645 | 6/1991 | Yoshida et al. | 396/87 |
| 5,027,147 | 6/1991 | Kaneda | 396/81 |
| 5,453,807 | 9/1995 | Iizuka | 359/823 |
| 5,543,971 | 8/1996 | Nomura et al. | 359/697 |
| 5,579,173 | 11/1996 | Hamasaki et al. | 359/700 |

FOREIGN PATENT DOCUMENTS

| | | |
|---|---|---|
| 57-100730 | 6/1982 | Japan . |
| 62-54236 | 3/1987 | Japan . |
| 63-113107 | 7/1988 | Japan . |
| 1296206 | 11/1989 | Japan . |

*Primary Examiner*—Loha Ben
*Attorney, Agent, or Firm*—Robin, Blecker & Daley

[57] ABSTRACT

An optical apparatus comprises a lens which can be moved in the direction of the optical axis, a moving unit for moving the lens, and a signal generator for detecting information about the movement of the lens, the signal generator comprising a wiring board which is disposed on a surface intersecting the optical axis at right angles and on which a signal generating pattern is formed, and a signal generating member which is moved around the optical axis by rotating the rotating member in the moving unit and which slides on the signal generating pattern. There is thus no need for providing a flexible printed wiring board, as conventional lens barrels.

40 Claims, 4 Drawing Sheets

OPTICAL APPARATUS HAVING HARD CIRCUIT BOARD ENCODER

CROSS REFERENCE TO RELATED APPLICATIONS

This application is a continuation of application Ser. No. 08/245,824, filed May 18, 1994, now abandoned, which is a continuation of Ser. No. 07/744,326, filed Aug. 13, 1991, now abandoned.

BACKGROUND OF THE INVENTION

1. Field of the Invention

The present invention relates to an optical apparatus provided with a signal generator.

2. Related Background Art

A lens barrel has recently been provided with a position detector for electrically detecting the position of a moving barrel so that the information about the position of the moving barrel, which is electrically detected by the position detector, is input to an information processor and used for various controls according to demand.

FIG. 4 is a longitudinally sectional view of a lens barrel of the type that is generally known. In the drawing, reference numeral 1 denotes a mount having a claw portion 1a for connecting the mount 1 to a camera body, and reference numeral 2 denotes a fixed barrel connected to the mount 1 and having a guide groove 2a parallel with the optical axis. Reference numeral 3 denotes a zoom ring rotatably supported by the fixed barrel 2 and comprising an outer barrel portion 3a and an inner barrel portion 3b having a cam groove 3c. Reference numeral 4 denotes a helicoid ring having a cam groove 4a with which a roller 5 provided on the zoom ring 3 is engaged, a helicoid 4b which is provided on the outer periphery thereof and a guide groove 4c which is provided on the inner periphery thereof and with which a straight key 6 provided on the fixed barrel 2 is engaged. Reference numeral 7 denotes a front group lens barrel having a lens group L1 and a helicoid 7a which is provided on the inner periphery thereof and in which the helicoid 4b of the helicoid ring 4 is screwed. Reference numeral 8 denotes a rear group lens barrel having a lens group L2 and a roller 9 which is provided on the outer periphery thereof and which is engaged with the guide groove 2a of the fixed barrel 2 and the cam groove 3c of the zoom ring 3. Reference numeral 10 denotes a contact member provided on the mount 1 so as to serve as an electrical contact with the camera body and connected, by soldering, to a ring-shaped circuit substrate 11 on which electrical parts are loaded to form an electrical circuit. Reference numeral 12 denotes a flexible printed board having one end which is connected to the circuit board 11 by soldering and the other end which is bonded to the fixed barrel 2, as well as having a position detecting Gray code pattern provided thereon. On the other hand, a brush 13 which slidably contacts with the Gray code pattern of the flexible printed board 12 is provided on the outer barrel portion 3a of the zoom ring 3 corresponding to a notched portion of the inner barrel portion 3b of the zoom ring 3. Reference numeral 14 denotes a rubber ring wound around the outer periphery of the zoom ring 3 so as to improve zooming operation properties.

The operation of the above-described arrangement is described below.

Magnification can be changed by rotating the zoom ring 3 around the optical axis. During this operation, the rear group lens barrel 8 having the lens group L2 is moved along the cam locus of the cam groove 3c of the zoom ring 3 in the direction of the optical axis because the roller 9 is movably supported by the guide groove 2a of the fixed barrel 2 only in the direction of the optical axis. At the same time, the male helicoid ring 4 is moved by the roller 5 in the direction of the optical axis opposite to the cam locus of the cam groove 4a because the helicoid ring 4 is supported so that the straight key 6 fixed to the fixed barrel 2 can be moved in the guide groove 4c only in the direction of the optical axis. At this time since relative movement is produced between the male helicoid ring 4 and the front group lens barrel 7, the lens group L1 is moved along the locus opposite to the cam groove 4a, like the male helicoid ring 4. As described above, the magnification is changed by rotating the zoom ring 3 around the optical axis so as to move the lens groups L1, L2 in the direction of the optical axis.

In addition, the focusing operation can be carried out by applying force in the rotational direction to the front group lens barrel 7 so as to move the front group lens barrel 7 having the lens group L1 in the direction of the optical axis while rotating it by employing the screw relation between the helicoid 4b and the helicoid 7a.

In this conventional example, a position detector comprises the brush 13, the flexible printed board 12 and part of the circuit formed on the circuit substrate 11. Namely, since the brush 13 is slidably moved on the Gray code pattern on the flexible printed board 12 as the zoom ring 3 is rotated, the instantaneous position of the brush 13 is electrically detected by the detection circuit on the circuit substrate 11 so that the position of the zoom ring 3, i.e., the focal distance in the lens system, can be detected.

However, in the above conventional example, the need for the flexible printed board 12 having the position detecting Gray code pattern causes an increase in the cost and the need for troublesome works of positioning the flexible printed board 12 when the flexible printed board 12 is bonded to the fixed barrel 2 and connecting the flexible printed board 12 to the circuit substrate 11.

In addition, the need for a space on the outer periphery of the fixed barrel 2 to which the flexible printed board 12 is bonded significantly affects other designs such as the position of the guide groove 2a, the formation of the cam groove 3c in the zoom ring and the like. This leads to deterioration in optical characteristics.

SUMMARY OF THE INVENTION

It is an object of this invention to provide an optical apparatus comprising a printed wiring board which is disposed on a surface intersecting the optical axis at right angles and on which a signal generating pattern is formed, a movable member which is rotated around the optical axis, and a signal generating member which slides on the signal generating pattern when the movable member is rotated.

DETAILED DESCRIPTION OF PREFERRED EMBODIMENT

The present invention is described below with reference to an embodiment shown in FIGS. 1 to 3.

Figure 1:
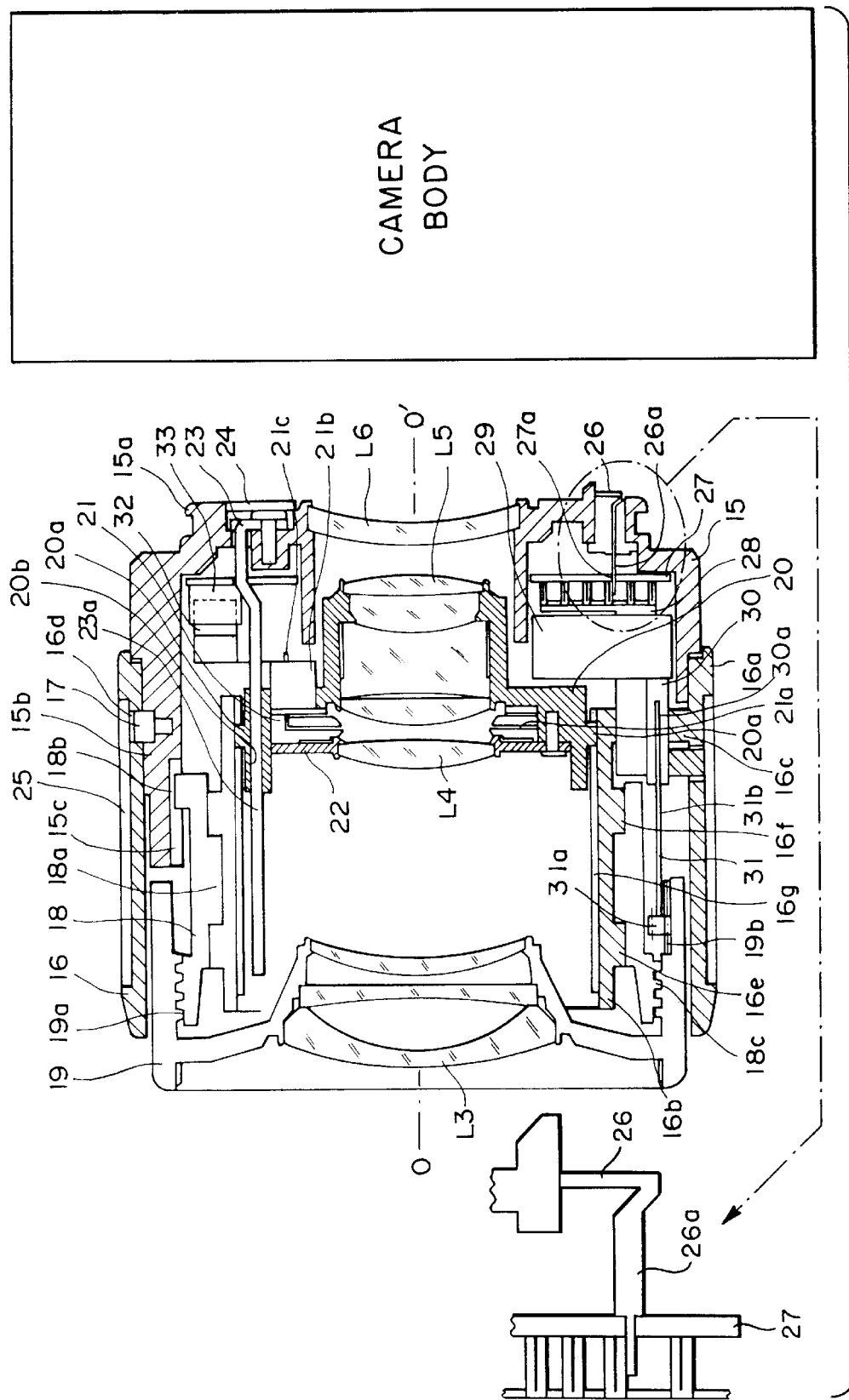
FIG. 1 is a longitudinally sectional view showing a lens barrel in accordance with an embodiment of the present invention.
Figure 2:
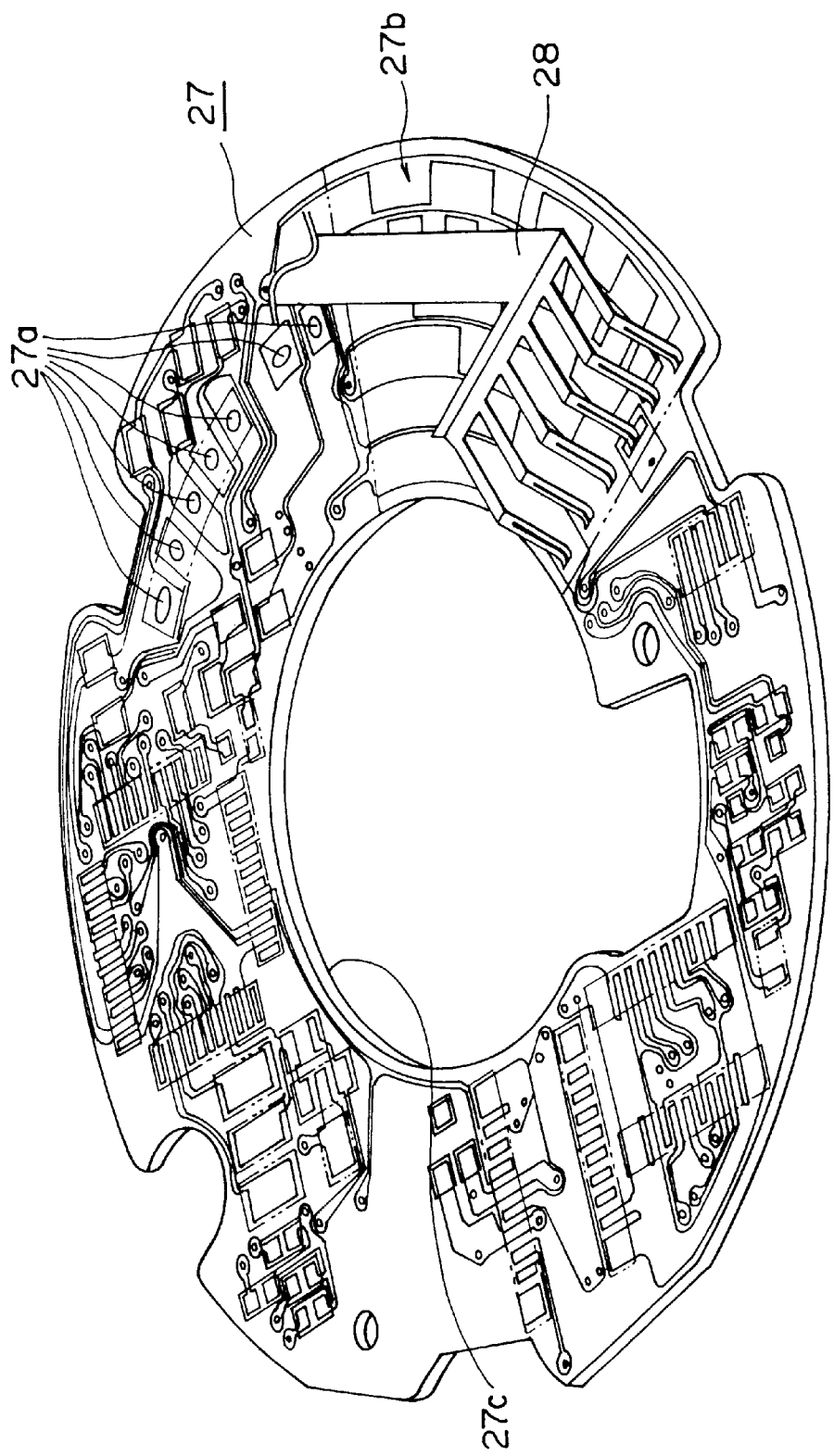
FIG. 2 is a perspective view of a principal portion of the lens barrel shown in FIG. 1.
Figure 3:
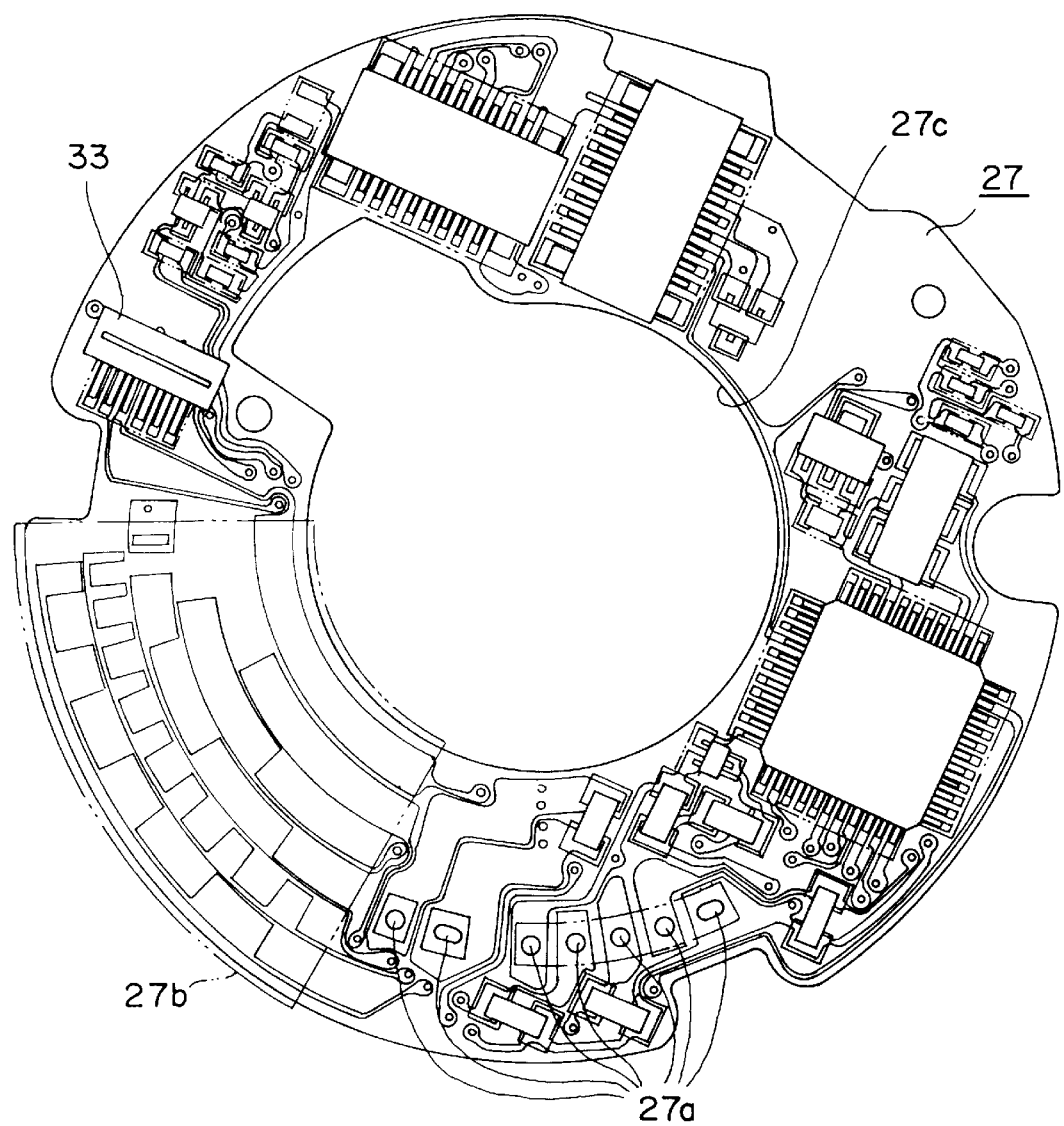
FIG. 3 is a plan view showing the package of the hard printed wiring board shown in FIG. 1.
Figure 4:
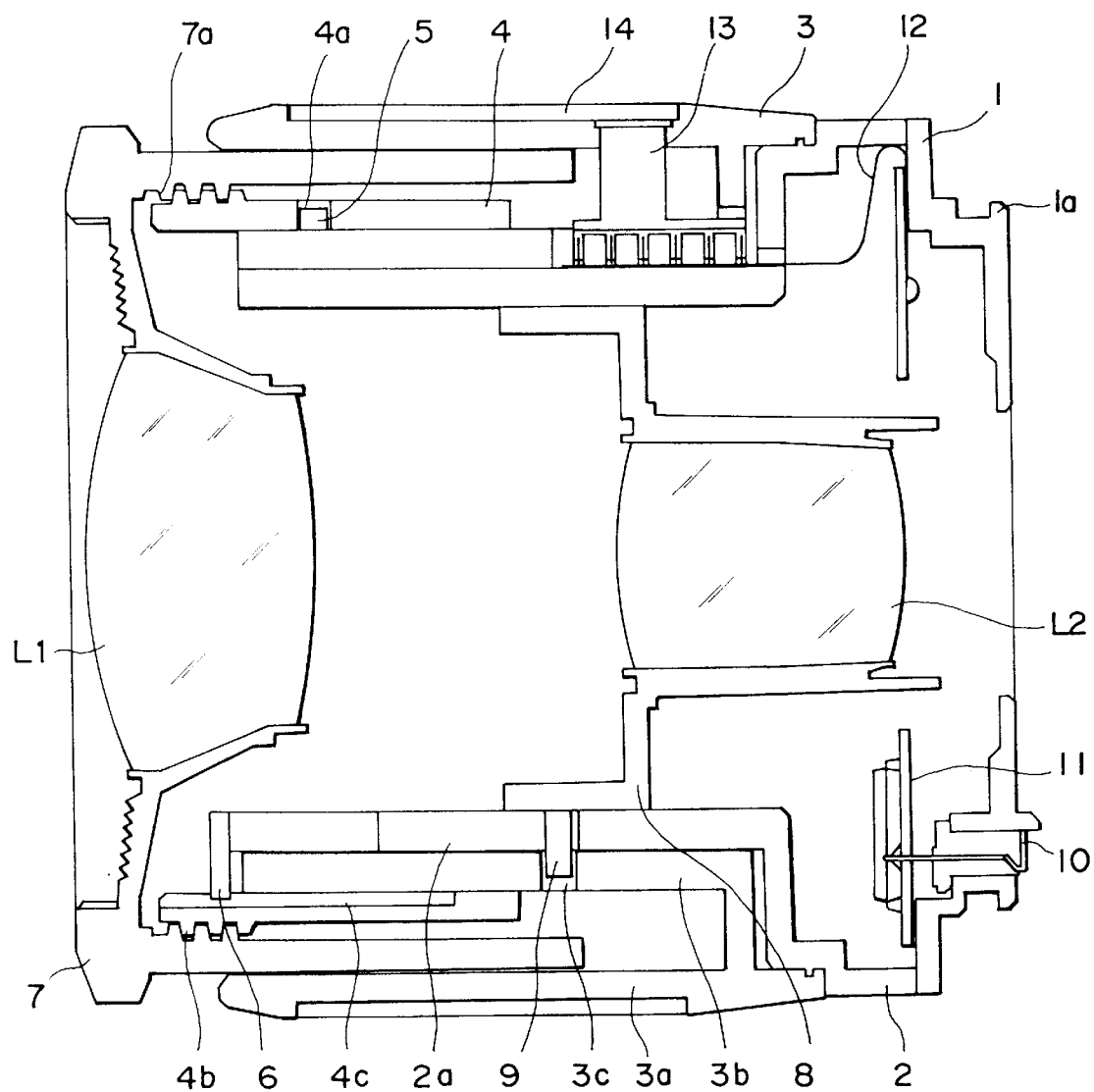
FIG. 4 is a longitudinally sectional view of a conventional lens barrel.

FIG. 1 is a longitudinally sectional view of a lens barrel, FIG. 2 is a perspective view of a principal portion, and FIG. 3 is a plan view showing the package of a hard printed wiring board.

Reference numeral 15 denotes a mount (fixing member) having a claw portion 15a for connecting the mount 15 to a camera body and three leg portions 15b each of which is forwardly (to the left in FIG. 1) extended along the lens optical axis and has a straight groove 15c provided on the inner side thereof parallel to the optical axis. Reference numeral 16 denotes a zoom cam ring having an outer barrel portion 16a and an inner barrel portion 16b, both of which are connected to each other by three connecting portions (bridge) 16c which are provided radially with respect to the optical axis. The outer barrel 16a has three circumferential grooves 16d circumferentially provided thereon, and the inner barrel 16b has three convex portions 16e and three convex portions 16f, which are provided on the outer periphery thereof, and three convex leads 16g provided on the inner periphery thereof. Reference numeral 17 denotes pins respectively provided on the three leg portions 15b of the mount 15 and engaged with the circumferential grooves 16d of the zoom cam groove 16. The pins 17 and the circumferential grooves 16d permit the zoom cam ring 16 to be rotated only around the optical axis relative to the mount 15. Reference numeral 18 denotes a male helicoid ring having a cam 18a provided on the inner periphery thereof so as to be held between the convex portions 16e and 16f of the zoom cam ring 16 and regulate the relative positional relation between the zoom ring 16 and the helicoid ring 18. On the outer periphery of the helicoid ring 18 are provided a helicoid 18c and a key portion 18b which is inserted into the straight groove 15c of the mount 15 so as to enable the helicoid ring 18 to move in the direction of the optical axis relative to the mount 15. Reference numeral 19 denotes a front group lens barrel which holds a lens group L3 and which has a gear portion 19b and a helicoid 19a engaged with the helicoid 18c of the male helicoid ring 18, the gear portion 19b and the helicoid 19a being provided on the inner periphery of the front group lens barrel 19.

Reference numeral 20 denotes a rear group lens barrel which holds a lens group L5 and which has convex portions 20a for respectively holding the leads 16g of the zoom cam ring 16 so as to regulate the relative positional relation to the zoom cam ring 16, and a straight groove 20b in parallel with the optical axis. Reference numeral 21 denotes an electromagnetic diaphragm comprising a blade portion 21a and a driving portion 21b. Reference numeral 22 denotes a lens barrel for holding a lens L4, which is fixed to the rear group lens barrel 20 by a vis so as to hold the electromagnetic diaphragm 21. Reference numeral 23 denotes a straight key fixed to the mount 15 by a vis and has a key portion 23a which is forwardly extended and engaged with the straight groove 20b so as to enable the rear group lens barrel 20 to be moved only in parallel with the optical axis. Reference numeral 24 denotes a back plate provided on the mount 15 so as to cover the straight key 23. Reference numeral 25 denotes a rubber ring wound around the outer periphery of the zoom cam ring 16.

Reference numeral 26 denotes a contact member provided on the mount 15 so as to serve as an electrical contact with the camera body. The lead armature 26a of the contact member 26 is passed through a hole 27a of a doughnut-shaped hard circuit substrate 27 on which electrical parts are loaded to form an electrical circuit and soldered in the state where the hard circuit substrate 27 abuts against a stepped portion provided on the lead armature 26a.

As shown in FIG. 2, a Gray code pattern 27b which forms part of the position detector is provided near the soldering portion of the substantially doughnut-like circuit substrate 27 disposed on the surface intersecting the optical axis O–O' at right angles. The central hole 27c of the circuit substrate 27 functions to allow the light from an object to pass therethrough.

On the other hand, the zoom cam ring 16 has a brush 28 provided thereon so as to slide on the Gray code pattern 27b of the hard circuit substrate 27. Reference numeral 29 denotes an autofocus driving portion having a motor as a driving source. The autofocus driving portion 29 is formed into a sectoral shape, fixed to the mount 15 and electrically connected to the hard circuit substrate 27. Reference numeral 30 denotes the output shaft of the driving portion 29 for forwardly outputting as rotational force in the direction of the optical axis the output from the autofocus driving portion 29. Reference numeral 31 denotes an output gear comprising a gear portion 31a engaged with the gear portion 19b of the front group lens barrel 19, and a shaft portion 31b having a D-shaped sectional form. The shaft portion 31b is inserted into a hole 30a of the output shaft 30, which hole has a D-shaped sectional form, so that the rotation of the output shaft 30 is transmitted to the front group lens barrel 19. Reference numeral 32 denotes a flexible printed board connected to the terminal 21c of the electromagnetic diaphragm 21 on one side thereof and having an end which has a U-like shape circumferentially formed around the optical axis and which is inserted into a connector 33 provided on the hard circuit substrate 27 so as to be electrically connected thereto.

The operation in the above-described arrangement is described below.

Magnification can be changed by rotating the zoom cam 16 around the optical axis. During this operation, since the male helicoid ring 18 and the rear group lens barrel 20 can be moved only in the direction of the optical axis because of the relation between the key portion 18b and the straight groove 15c of the mount 15 and between the straight groove 20 and the straight key 23, the helicoid ring 18 and the rear group lens barrel 20 are moved backward and forward in the direction of the optical axis according to the relation between the convex portions 16e, 16f and the cam 18a or the leads 16g and the convex portions 20a.

The focusing operation can be carried out by rotating the front group lens barrel 19 by using the output from the autofocus driving portion 29 so as to backwardly and forwardly move the lens group L3 by employing the relation between the helicoids 18c and 19a.

In this embodiment, the position detector comprises the brush 28 and the Gray code pattern 27b on the hard circuit substrate and part of the circuit thereon. The position of the zoom cam ring 16, i.e., a change in the focal distance in the lens system, is detected by the relatively positional relation in the circumferential direction between the brush 28 rotated around the optical axis integrally with the zoom cam ring 16, which cannot be moved in the direction of the optical axis, and the Gray code pattern 27b.

The lens barrel in the embodiment of this invention having the above configuration need not have a flexible printed board for position detection, as in conventional lens barrels, and it is thus low priced. The lens barrel in this embodiment also has the following advantages:

(1) Since there is no need for a place to which a position detection flexible printed board is bonded, the degree of freedom for the moving amount of the lens, the position and shape of the cam is increased, and an attempt can thus be made to improve the optical properties, holding accuracy and operating feel of the lens and the like.

(2) Since the mount unit in which the contact member 26 having the hard circuit substrate 27 and the autofocus driving portion 29 are provided on the mount, and the lens barrel unit comprising an assembly of the zoom cam ring 16, the male helicoid ring 18, the front group lens barrel, the rear group lens barrel 20 and the brush 28, are connected by the pin 17, a sliding relation is automatically produced between the Gray code pattern 27b and the brush 28 to form a signal generator. The steps of positioning the flexible printed board, bonding it and connecting the circuit substrate to the flexible printed board can be removed, as compared with conventional lens barrels, and thus the workability of assembly can be significantly improved. In addition, since the Gray code pattern 27b is formed in a portion near the portion where the hard printed wiring board 27 is soldered to the contact member 26, a stable signal can be obtained with high precision, without being affected by the curvature and deformation of the hard printed wiring board 27.

Although the position of the zoom lens is detected in this embodiment, the position of the focus lens may be detected. In this case, for example, the brush 28 may be rotated in linkage with a range ring.

As described above, this embodiment has the signal generator comprising the signal generating member provided so as to be rotated relative to the printed wiring board disposed on the surface intersecting the optical axis at right angles and the signal generating pattern formed on the wiring board. There is thus no need for providing the flexible printed wiring board along the circumferential direction, as conventional lens barrels. The embodiment thus has the effect of enabling an attempt to be made to save space and improving the workability of assembly.

I claim:

1. An optical apparatus comprising:
   (a) a lens which can be moved in the direction of an optical axis of the apparatus;
   (b) moving means for moving said lens; and
   (c) a signal generator for detecting information about the movement of said lens, said signal generator comprising a circuit board which is disposed on a plane intersecting the optical axis and on which a signal generating pattern and a connector are formed, and a signal generating member which is moved around the optical axis by a rotating member in said moving means and which slides on said signal generating pattern, wherein said signal generating pattern and said connector are provided on the same surface of said circuit board and wherein a wiring member in said apparatus is inserted into said connector; and
   (d) a contact member contacting with another apparatus so as to electrically connect said optical apparatus to said another apparatus, said contact member having an elongated lead portion, the lead portion being soldered to the circuit board.

2. An apparatus according to claim 1, wherein magnification can be changed by moving said lens in the direction of the optical axis.

3. An apparatus according to claim 1, wherein focusing can be performed by moving said lens in the direction of the optical axis.

4. An apparatus according to claim 1, wherein said moving means has an operating ring supported so as to be rotatable around the optical axis, and when said operating ring is rotated, said lens is moved in the direction of the optical axis through a mechanism for converting rotation into movement in the direction of the optical axis.

5. An apparatus according to claim 4, wherein said signal generating member is mounted on said operating ring so that said signal generating member is moved around the optical axis by rotating said operating ring.

6. An apparatus according to claim 5, wherein a sliding brush is used as said signal generating member in said signal generator.

7. An apparatus according to claim 6, wherein a Gray code pattern is used as said signal generating pattern.

8. An apparatus according to claim 4, wherein said circuit board is formed into a substantially doughnut-like shape and has a plurality of circuit elements loaded thereon.

9. An apparatus according to claim 1, wherein a sliding brush is used as said signal generating member in said signal generator.

10. An apparatus according to claim 9, wherein a Gray code pattern is used as said signal generating pattern.

11. An apparatus according to claim 10, wherein said circuit board is formed into a substantially doughnut-like shape and has a plurality of circuit elements loaded thereon.

12. An apparatus according to claim 9, wherein said circuit board is formed into a substantially doughnut-like shape and has a plurality of circuit elements loaded thereon.

13. An apparatus according to claim 1, wherein said circuit board is formed into a substantially doughnut-like shape and has a plurality of circuit elements loaded thereon.

14. An apparatus according to claim 13, wherein said plurality of circuit elements are loaded on the same surface as that of said signal generating pattern.

15. An apparatus according to claim 1, wherein a lens barrel is used as said optical apparatus.

16. An apparatus according to claim 15, wherein said lens barrel has a plurality of lens groups and has both functions of changing magnification and focusing.

17. An apparatus according to claim 16, wherein said circuit board has a substantially doughnut-like shape and a central region through which light from an object is passed.

18. An apparatus according to claim 15, wherein said circuit board is disposed near the rear end of the optical axis of said lens barrel.

19. An apparatus according to claim 1, wherein the lead portion has a stepped portion for abutting said circuit board.

20. The apparatus of claim 1 wherein said wiring member is a flexible print circuit board.

21. An optical apparatus comprising:
   (a) a lens which can be moved in the direction of an optical axis of the apparatus;
   (b) moving means for moving said lens;
   (c) a signal generator for detecting information about the movement of said lens, said signal generator comprising a circuit board which is disposed on a plane intersecting the optical axis at right angles and on a surface of which a signal generating pattern and a connector are formed, and a signal generating member which is moved around the optical axis by rotating a rotating member in said moving means and which slides on said signal generating pattern, wherein a wiring member in said apparatus is inserted into said connector; and
   (d) a contact member contacting with another apparatus so as to electrically connect said optical apparatus to said another apparatus, said contact member having an elongated lead portion, the lead portion being soldered to a surface perpendicular to the optical axis of the circuit board, wherein said contact member is disposed at a rearward portion of said optical apparatus, and said circuit board is disposed in the proximity of said rearward portion of said optical apparatus.

22. An apparatus according to claim 21, wherein the lead portion has a stepped portion for abutting said circuit board.

23. The apparatus of claim 21 wherein said wiring member is a flexible print circuit board.

24. An optical apparatus comprising:

a rotation member rotating around an optical axis of the apparatus, for moving an optical system along the optical axis;

a signal generating member moving along a plane perpendicular to the optical axis by a rotation of said rotation member, and for generating a signal relating to said optical system by reading an information pattern; and a circuit board on a surface of which a connector and the information pattern are formed, said circuit board being disposed on a plane intersecting the optical axis, wherein a wiring member in said apparatus is inserted into said connector.

25. An apparatus according to claim 24, further comprising a contact member for electrically connecting said optical apparatus to another apparatus.

26. An apparatus according to claim 25, wherein said contact member has a lead portion being elongated to a direction of the optical axis, and the lead portion being connected to the surface of said circuit board.

27. An apparatus according to claim 26, wherein the lead portion is connected to said surface in the proximity of the information pattern.

28. An apparatus according to claim 26, wherein the lead portion has a stepped portion for abutting said circuit board.

29. An apparatus according to claim 24, wherein the information pattern is a code pattern.

30. An apparatus according to claim 29, wherein the code pattern includes a code representing a position of said optical system.

31. An apparatus according to claim 24, wherein said signal generating member includes a brush contacting the information pattern.

32. An apparatus according to claim 31, wherein the information pattern is a code pattern.

33. An apparatus according to claim 32, wherein the code pattern includes a code representing a position of said optical system.

34. The apparatus of claim 24 wherein said wiring member is a flexible print circuit board.

35. An optical apparatus comprising:

(a) a lens which can be moved in the direction of an optical axis of the apparatus;

(b) moving means for moving said lens;

(c) a signal generator for detecting information about the movement of said lens, said signal generator comprising a circuit board which is disposed on a plane intersecting the optical axis and on which a signal generating pattern and a connector are formed, and a signal generating member which is moved around the optical axis by a rotating member in said moving means and which slides on said signal generating pattern, wherein a wiring member in said apparatus is inserted into said connector;

(d) a contact member contacting with another apparatus so as to electrically connect said optical apparatus to said another apparatus, said contact member having an elongated lead portion, the lead portion being soldered to the circuit board.

36. An optical apparatus comprising:

(a) a lens which can be moved in the direction of an optical axis of the apparatus;

(b) moving means for moving said lens;

(c) a signal generator for detecting information about the movement of said lens, said signal generator comprising a circuit board which is disposed on a plane intersecting the optical axis and on which a signal generating pattern and a connector are formed, and a signal generating member which is moved around the optical axis by a rotating member in said moving means and which slides on said signal generating pattern, wherein said signal generating pattern and said connector are provided on the same surface of said circuit board and wherein a wiring member in said apparatus is inserted into said connector;

(d) a contact member contacting with another apparatus so as to electrically connect said optical apparatus to said another apparatus, said contact member electrically connecting with the circuit board.

37. An optical apparatus comprising:

(a) a lens which can be moved in the direction of an optical axis of the apparatus;

(b) moving means for moving said lens;

(c) a signal generator for detecting information about the movement of said lens, said signal generator comprising a circuit board which is disposed on a plane intersecting the optical axis and on which a signal generating pattern and a connector are formed, and a signal generating member which is moved around the optical axis by a rotating member in said moving means and which slides on said signal generating pattern, wherein a wiring member in said apparatus is inserted into said connector;

(d) a contact member contacting with another apparatus so as to electrically connect said optical apparatus to said another apparatus, said contact member electrically connecting with the circuit board.

38. An optical apparatus comprising:

(a) a lens which can be moved in the direction of an optical axis of the apparatus;

(b) moving means for moving said lens;

(c) a signal generator for detecting information about the movement of said lens, said signal generator comprising a circuit board which is disposed on a plane intersecting the optical axis at right angles and on which a surface of which a signal generating pattern and a connector are formed, and a signal generating member which is moved around the optical axis by rotating a rotating member in said moving means and which slides on said signal generating pattern wherein said signal generating pattern and said connector are provided on the same surface of the circuit board and wherein a wiring member in said apparatus is inserted into said connector; and (d) a contact member contacting with another apparatus so as to electrically connect said optical apparatus to said another apparatus, said contact member having an elongated lead portion, the lead portion being soldered to a surface perpendicular to the optical axis of the circuit board, wherein said contact member is disposed at a rearward portion of said optical apparatus, and said circuit board is disposed in the proximity of said rearward portion of said optical apparatus.

39. An optical apparatus comprising:

(a) a lens which can be moved in the direction of an optical axis of the apparatus;

(b) moving means for moving said lens;

(c) a signal generator for detecting information about the movement of said lens, said signal generator comprising a circuit board which is disposed on a plane intersecting the optical axis at right angles and on a surface of which a signal generating pattern and a connector are formed, and a signal generating member which is moved around the optical axis by rotating a rotating member in said moving means and which slides on said signal generating pattern, wherein a wiring member in said apparatus is inserted into said connector; and (d) a contact member contacting with another apparatus so as to electrically connect said optical apparatus to said another apparatus, said contact member electrically connecting with the circuit board, wherein said contact member is disposed at a rearward portion of said optical apparatus, and said circuit board is disposed in the proximity of said rearward portion of said optical apparatus.

40. An optical apparatus comprising:

(a) a lens which can be moved in the direction of an optical axis of the apparatus;

(b) moving means for moving said lens;

(c) a signal generator for detecting information about the movement of said lens, said signal generator comprising a circuit board which is disposed on a plane intersecting the optical axis at right angles and on a surface of which a signal generating pattern and a connector are formed, and a signal generating member which is moved around the optical axis by rotating a rotating member in said moving means and which slides on said signal generating pattern, wherein said signal generating pattern and said connector are provided on the same surface of the circuit board and wherein a wiring member in said apparatus is inserted into said connector; and (d) a contact member contacting with another apparatus so as to electrically connect said optical apparatus to said another apparatus, said contact member electrically connecting with the circuit board, wherein said contact member is disposed at a rearward portion of said optical apparatus, and said circuit board is disposed in the proximity of said rearward portion of said optical apparatus.

* * * * *